(12) United States Patent
Metzger et al.

(10) Patent No.: US 11,949,400 B2
(45) Date of Patent: Apr. 2, 2024

(54) MULTIPLE LAYER SYSTEM, METHOD OF MANUFACTURE AND SAW DEVICE FORMED ON THE MULTIPLE LAYER SYSTEM

(71) Applicant: RF360 SINGAPORE PTE. LTD., Singapore (SG)

(72) Inventors: Thomas Metzger, Munich (DE); Yoshikazu Kihara, Honjo (JP); Thomas Pollard, Longwood, FL (US)

(73) Assignee: RF360 Singapore Pte. Ltd., Singapore (SG)

( * ) Notice: Subject to any disclaimer, the term of this patent is extended or adjusted under 35 U.S.C. 154(b) by 850 days.

(21) Appl. No.: 16/977,753

(22) PCT Filed: Feb. 4, 2019

(86) PCT No.: PCT/EP2019/052623
§ 371 (c)(1),
(2) Date: Sep. 2, 2020

(87) PCT Pub. No.: WO2019/170334
PCT Pub. Date: Sep. 12, 2019

(65) Prior Publication Data
US 2021/0013862 A1     Jan. 14, 2021

(30) Foreign Application Priority Data
Mar. 7, 2018    (DE) ............... 10 2018 105 290.1

(51) Int. Cl.
*H03H 3/08*      (2006.01)
*H01L 41/08*      (2006.01)
(Continued)

(52) U.S. Cl.
CPC .......... *H03H 9/02574* (2013.01); *H03H 3/08* (2013.01); *H03H 9/02834* (2013.01);
(Continued)

(58) Field of Classification Search
CPC ...... H03H 9/25; H03H 9/145; H03H 9/02574; H03H 9/02834; H03H 3/08; H10N 30/079; H10N 30/10516
(Continued)

(56) References Cited

U.S. PATENT DOCUMENTS 5,030,930 A    7/1991   Sugai
5,498,920 A    3/1996   Okano et al.
(Continued)

FOREIGN PATENT DOCUMENTS

GB      2181917 A     4/1987
JP      S58156215 A   9/1983
(Continued)

OTHER PUBLICATIONS

Parsapour F., et al., "Ex-situ AlN Seed Layer for (0001)-Textured Al0.84Sc0.16N Thin Films Grown on SiO2 Substrates", 2017 IEEE International Ultrasonics Symposium (IUS), IEEE, Sep. 2017 (Sep. 6, 2017), XP033244663, pp. 1-4, DOI: 10.1109/ULTSYM.2017.8091524 [retrieved on Oct. 31, 2017].
(Continued)

*Primary Examiner* — Shawki S Ismail
*Assistant Examiner* — Monica Mata
(74) *Attorney, Agent, or Firm* — Patterson + Sheridan LLP

(57) ABSTRACT

A layer system especially for forming SAW devices thereon is proposed comprising a monocrystalline sapphire substrate having a first surface and a crystalline piezoelectric layer comprising MN, deposited onto the first surface, and having a second surface. As a first surface a crystallographic R-plane of sapphire is used enabling an orientation of c-axis of the piezoelectric layer parallel to the first and second surfaces.

11 Claims, 4 Drawing Sheets

Figure 1:
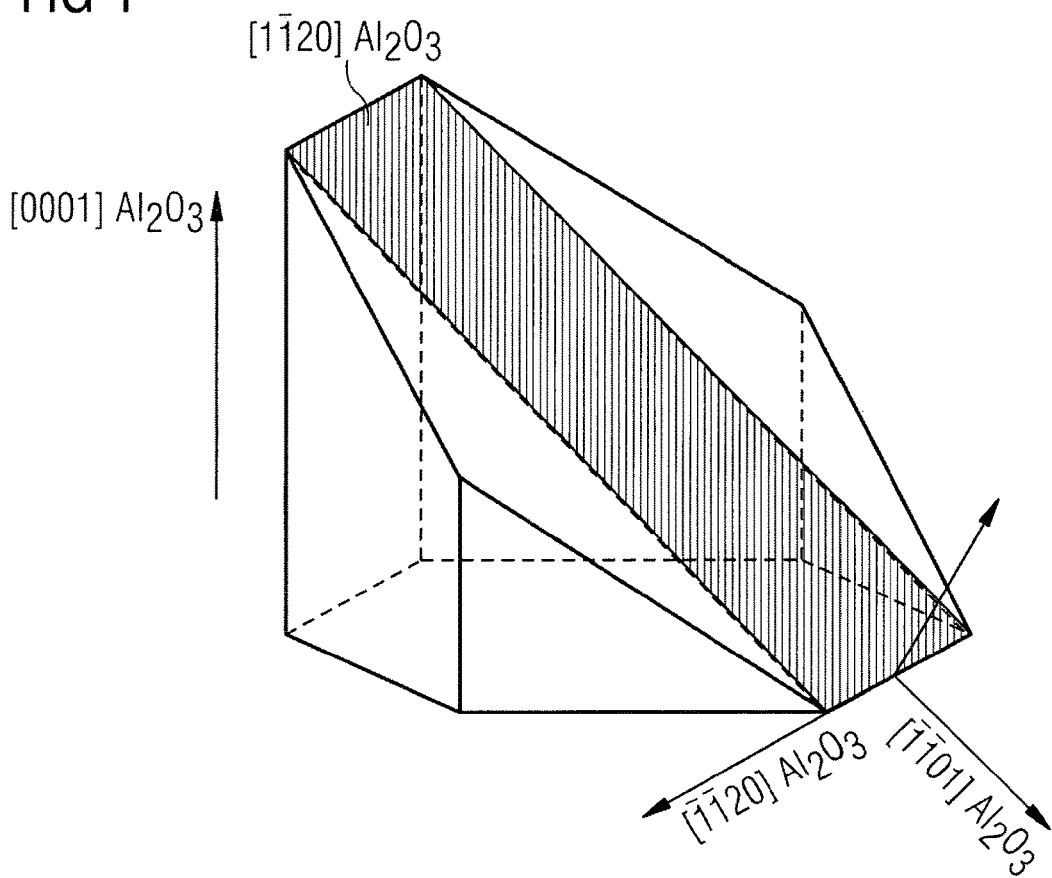

(51) Int. Cl.
  *H01L 41/319* (2013.01)
  *H03H 9/02* (2006.01)
  *H03H 9/145* (2006.01)
  *H03H 9/25* (2006.01)
  *H10N 30/00* (2023.01)
  *H10N 30/079* (2023.01)

(52) U.S. Cl.
  CPC .............. *H03H 9/145* (2013.01); *H03H 9/25* (2013.01); *H10N 30/079* (2023.02); *H10N 30/10516* (2023.02)

(58) Field of Classification Search
  USPC ..................................................... 310/313 A
  See application file for complete search history.

(56) References Cited

U.S. PATENT DOCUMENTS

| | | |
|---|---|---|
| 10,079,334 B2 | 9/2018 | Moulard et al. |
| 2002/0047497 A1 | 4/2002 | Higuchi |
| 2008/0296529 A1 | 12/2008 | Akiyama et al. |

FOREIGN PATENT DOCUMENTS

| | | |
|---|---|---|
| JP | 2002198775 A | 7/2002 |
| JP | 2009010926 A | 1/2009 |
| JP | 2011176546 A | 9/2011 |
| WO | 2014094883 | 6/2014 |

OTHER PUBLICATIONS

International Search Report and Written Opinion dated May 15, 2019 corresponding to Application No. PCT/EP2019/052623.

Euler angles (0, 90, 0)

Euler angles (0, 90, 90)

MULTIPLE LAYER SYSTEM, METHOD OF MANUFACTURE AND SAW DEVICE FORMED ON THE MULTIPLE LAYER SYSTEM

CROSS-REFERENCE TO RELATED APPLICATIONS

This application is a national stage application under 35 U.S.C. 371 of PCT/EP2018/081073, filed Feb. 4, 2019, which claims the benefit of German Application No. 10 2018 105 290.1, filed Mar. 7, 2018, both of which are incorporated herein by reference in their entireties.

The invention relates to a layer system comprising a thin piezoelectric film, a method of manufacture and a SAW device formed on the layer system with the piezoelectric layer.

In recent years standard SAW technology based on lithium tantalate LT wafers to realize RF filters in the 500 MHz to 3 GHz region has been more and more replaced by advanced micro-acoustic technologies like BAW or temperature compensated SAW in order to fulfill the ever-increasing performance requirements of mobile phone systems.

WCDMA and LTE based mobile phones require lowest loss RF filters, duplexers and multiplexers to support advanced RF concepts like carrier aggregation, diversity antenna and MIMO concepts or new modulation schemes. With the new 5G standard the requirements for micro-acoustic devices will further increase with respect to several key characteristics like lowest losses, reduced temperature drift over temperature, higher linearity and power durability, new frequency bands between 3 and 6 GHz and larger filter bandwidth. In addition, there is an ongoing demand for reducing costs, size and height of the micro-acoustic devices.

Today basically two micro-acoustic technologies (SAW and BAW) are used to realize high performance resonators, filters, duplexers and multiplexers for mobile phone applications. SAW technology is predominantly utilizing single wafer material like lithium tantalate LT or lithium niobate LN as piezoelectric substrate on which suitable metal based electrode structures (e.g. interdigital transducers) are realized to excite surface acoustic waves. Additional functional layers like passivation layers consisting e.g. of silicon nitride, temperature compensation layers consisting e.g. of amorphous silicon oxide or thick metal interconnects are used to further improve the device performance.

More advanced SAW devices are using thin piezoelectric single crystal layers bonded onto a carrier wafer. Within these devices an energy confinement in the piezoelectric layer can be realized by a wave-guiding effect leading overall to further reduced losses. By choosing the layer system properly, additional characteristics of the micro acoustic device can be enhanced e.g. by introducing additional layers as mentioned above or by using a high resistivity silicon wafer with good thermal conductivity to improve heat dissipation and power durability. The thin piezoelectric single crystal layer is typically realized by bonding a single crystal wafer onto the carrier substrate by means of well-known wafer bonding methods and then thinning down the piezoelectric wafer to the required layer thickness typically in the range of half a quarter wavelength to a wavelength of the micro-acoustic wave by means of wafer grinding and polishing methods.

Achieving a highly uniform piezoelectric layer with respect to layer thickness requires advanced thinning methods. Typically, the orientation of the piezoelectric layer (crystallographic orientation) is carefully chosen based on advanced simulation and modeling methods like finite element simulation (FEM) to achieve the best device performance. Since the piezoelectric wafer material is typically grown by means of single crystal growth methods from the melt, a large variety of possible crystal orientations is available. A major drawback is the non-availability of large diameter wafer solutions like 200 mm and 300 mm wafers since e.g. lithium tantalate wafers with such large diameters are today not available in production volumes.

A different method to realize thin piezoelectric layers would be the deposition of such layers by well-known thin film deposition methods like sputtering, pulsed laser deposition (PLD), chemical vapor deposition (CVD) including metal-organic CVD (MOCVD) and plasma-enhanced CVD (PECVD), molecular beam epitaxy (MBE), atomic layer deposition (ALD) or sol-gel deposition. With these technologies it is possible to grow the piezoelectric layers (typically aluminum nitride AlN or scandium doped aluminum nitride AlScN) for BAW devices on a suitable wafer substrate like high resistivity silicon. Typically, the AlN based piezoelectric films for BAW devices are today grown by sputtering methods where a highly oriented but polycrystalline thin film is realized with an orientation of the crystallographic c-axis perpendicular to the substrate surface. These highly oriented polycrystalline piezoelectric layers support very well the propagation of longitudinal waves along the crystallographic c-axis of the AlN based piezoelectric layer. With this design and structure low loss BAW resonators and devices can be realized. Nevertheless, the in-plane orientation of the AlN based crystallites is less pronounced compared to real single crystal or epitaxial layers since an epitaxial growth of the AlN based piezoelectric layer cannot be achieved with the typically used low temperature sputter methods.

Typically, the realization of thin film piezoelectric layers by means of thin film deposition methods has significant advantages like a very good thickness control, good layer adhesion, low cost process, low material consumption, full integration into a wafer line, realization of layers on large diameter wafers and easy variation of the chemical layer composition compared to the bonding and thinning approach with single crystal wafers.

Therefore, several approaches have been made to utilize such AlN based thin films for the realization of SAW devices to benefit both from the thin film approach compared to a single crystal approach as mentioned above and the SAW design flexibility compared to BAW design. SAW are patterned by lithography methods with an excellent uniformity allowing the realization of resonators all having different frequencies in one process step. In BAW technology the thickness of the piezoelectric layer is the main frequency defining feature. Trimming methods allow to realize a high frequency uniformity. The realization of resonators with different frequencies on one wafer requires multiple process steps like the subsequent deposition and patterning of layers.

Main limitation when combining SAW design principles and AlN based piezoelectric layers grown by thin film deposition methods is the orientation of the AlN based layers. Since the crystallographic c-axis is always oriented more or less perpendicular to the substrate surface when using low temperature sputtering, the main piezoelectric coupling is also perpendicular to the substrate surface whereas a laterally propagating surface acoustic wave on the substrate surface would need the c-axis significantly inclined with respect to the surface normal to achieve a sufficiently large filter bandwidth.

Also, special electrode configurations can help to excite surface acoustic waves or Lamb waves/plate modes with a lateral propagation direction although the crystallographic c-axis of the AlN based layer is perpendicular to the substrate surface. Nevertheless, it is hardly possible to achieve an effective coupling coefficient for micro-acoustic resonators above 5% with this design even when utilizing AlN layers with a significant level e.g. of Sc doping finally limiting the combination of SAW structures and AlN based thin piezoelectric films to a few applications where only small filter bandwidths are required.

Therefore, it would be beneficial to realize a layer system exhibiting an AlN based piezoelectric thin film grown by thin film deposition methods where the crystallographic c-axis is significantly inclined with respect to the normal of the substrate surface.

This and other objects are met by a layer system according to claim 1. A method of manufacture as well as a SAW device formed on the layer system are given by further claims.

This invention provides a different approach how to realize a layer system with an AlN based piezoelectric layer having the c-axis more or less parallel to the substrate surface.

It is proposed to use a monocrystalline sapphire substrate having a crystallographic R-plane of sapphire (assigned as (1-102)-plane in Bravais Miller notation) as a first surface. Onto this first surface a crystalline piezoelectric layer comprising AlN can be epitaxially grown according to the epitaxial law where the (11-20)-plane of the AlN based layer is parallel to the (1-102)-plane of sapphire, the in-plane [1-100]-direction of the AlN based layer is parallel to the [−1-120]-direction of sapphire and the in-plane [000-1]-direction (crystallographic c-axis) of the AlN based layer is parallel to the [1-10-1]-direction of sapphire. An epitaxial growing of this AlN based layer yields a preferred orientation where the crystallographic c-axis is more or less parallel to the substrate surface. As a result the second surface that is the surface of the crystalline piezoelectric layer is the (11-20)-plane.

With the novel layer system it is possible to yield a high coupling parallel the c-axis and hence parallel to the layer plane. As a result the piezoelectric layer is adapted to form a SAW device thereon that achieves a high coefficient of coupling. The layer can be formed by commonly used layer growing techniques that are controllable to achieve epitaxial growth.

Sapphire with its high thermal conductivity, its low electrical conductivity and its low RF losses in combination with the high sound velocity is an ideal substrate material to realize micro-acoustic RF-devices and is available in wafer form with an R-plane as a first surface. Moreover, such sapphire wafers are available with higher wafer diameters than monocrystalline piezo wafers out of LT or LN that are cut from a melt-drawn ingot. However, despite the availability of R-plane sapphire and its former use e.g. as a substrate for growing layers for optoelectronic applications, R-plane sapphire has hardly been used as a substrate for micro-acoustic devices.

A layer system with an additionally improved high piezoelectric coupling parallel to the substrate surface comprises AlN based piezoelectric layers doped with suitable dopants like Sc. A dopant like Sc can be used to improve the piezoelectric coupling of AlN and to increase the piezoelectric response of the piezoelectric layer.

AlScN too can be grown epitaxially on the newly proposed R-plane sapphire by means of suitable deposition methods like high temperature sputtering, PLD, MOCVD, ALD or MBE.

Dependent on the use of the layer system different amounts of doping can be used. Hence, according to an embodiment the piezoelectric layer comprises AlScN wherein the amount of Sc contained in the piezoelectric layer is between 5 and 45 at %. However, any dopant that improves the piezoelectric coupling may be advantageous too.

In preferred embodiments the layer system comprises an crystallographic orientation of the piezoelectric AlN layer where the (11-20)-plane of the AlN layer is parallel to the (1-102)-plane of sapphire, the in-plane [1-100]-direction of the AlN layer is parallel to the [−1-120]-direction of sapphire and the in-plane [000-1]-direction (crystallographic c-axis) of the AlN layer is parallel to the [1-10-1]-direction of sapphire.

In preferred embodiment the piezoelectric layer comprises AlN doped with Sc and is arranged on a seed layer of epitaxial pure undoped AlN. The seed layer is hence arranged between the substrate and the piezoelectric AlScN layer. This AlN seed layer also helps to create a wave guiding effect due to the larger sound velocity in the AlN compared to the sound velocity in the e.g. Sc doped AlN. A wave guiding piezoelectric layer allows propagation of SAW with lower loss an hence with a higher efficiency. Occurrence of spurious modes is also suppressed in a wave-guiding layer system.

Also in order to unambiguously define the growth direction of the polar c-axis of the piezoelectric layer, a slight tilting in the range of 0.5 to 6 degrees of the R-plane sapphire surface might be necessary.

The layer system may further comprise a passivation layer and/or a temperature compensating layer of $SiO_2$ deposited onto the second surface.

Using this wafer with the epitaxial grown AlN based layer system on top, electrode structures to excite acoustic waves like interdigital transducers can be realized on the surface of the AlN based layer system where the orientation of these structures with respect to the crystal orientation can be chosen in a way that an optimum performance with respect to usable wave type, piezoelectric coupling, non-occurrence of spurious modes, temperature coefficient of frequency, loss mechanisms and other critical parameters is achieved. Variations on a given layer system are possible by a rotation of the IDT orientation around the surface normal of the layer system. The interdigital transducers IDT may have any in-plane orientation with a rotation angle between 0° and 90° around the surface normal.

The sound velocity along the propagation direction and pitch of the interdigitated electrode structure define the frequency and wavelength of the so excitable SAW. Then, a preferred thickness of the doped AlN layer can be set typically in the range of 0.3 to 3.0 times the wavelength λ of the surface acoustic wave SAW.

According to an embodiment the interdigital electrode structure comprises Cu and/or Al.

Further functional layers chosen from the group of passivation layer, trimming layer of SiN and temperature compensation layer may be incorporated into the layer sequence of the layer system, preferably above the piezoelectric layer.

In the following the invention will be explained in more detail with reference to specific embodiments and the accompanying figures. The figures are schematically only and are not drawn to scale. For better understanding some details may be depicted in enlarged form.

FIG. 1 shows schematically the position of the R-plane within a sapphire basic crystal.

Figure 2:
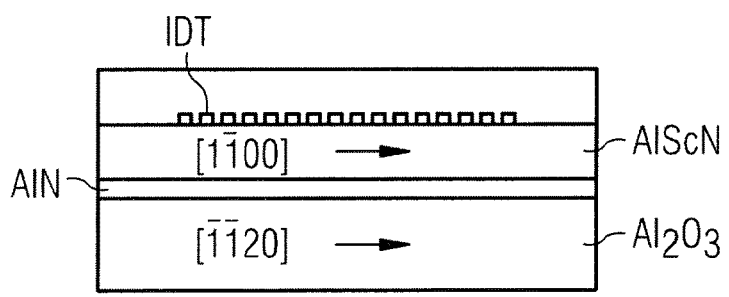
Figure 3:
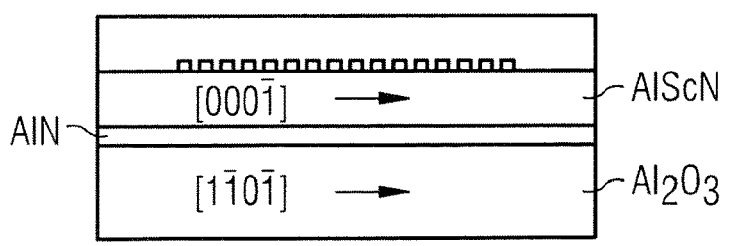
Figure 4:
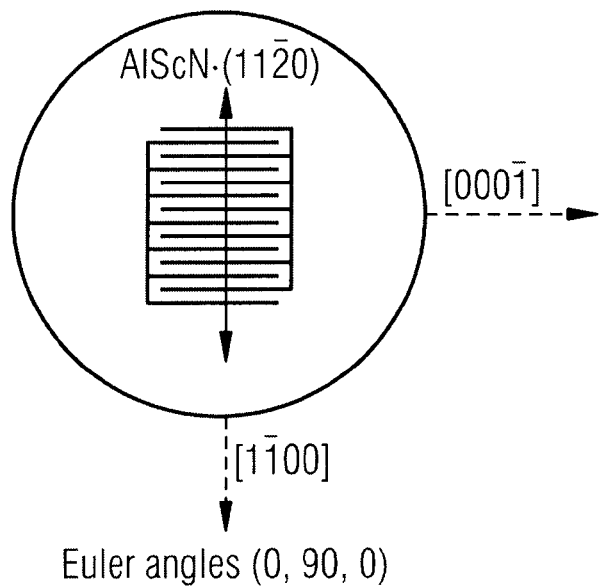
Figure 5:
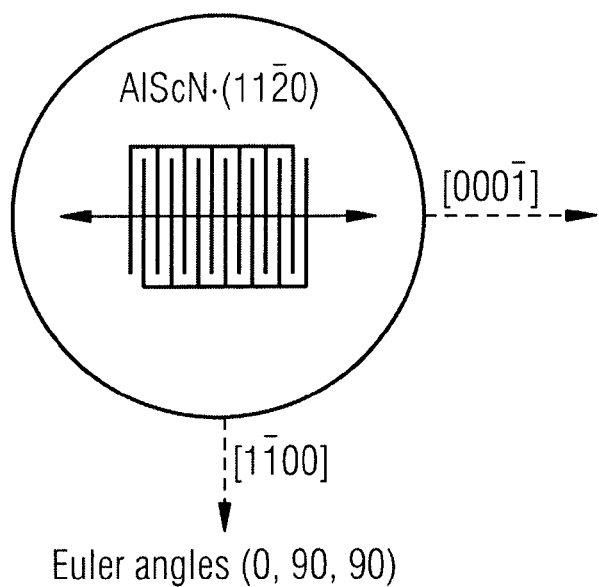
Figure 6A:
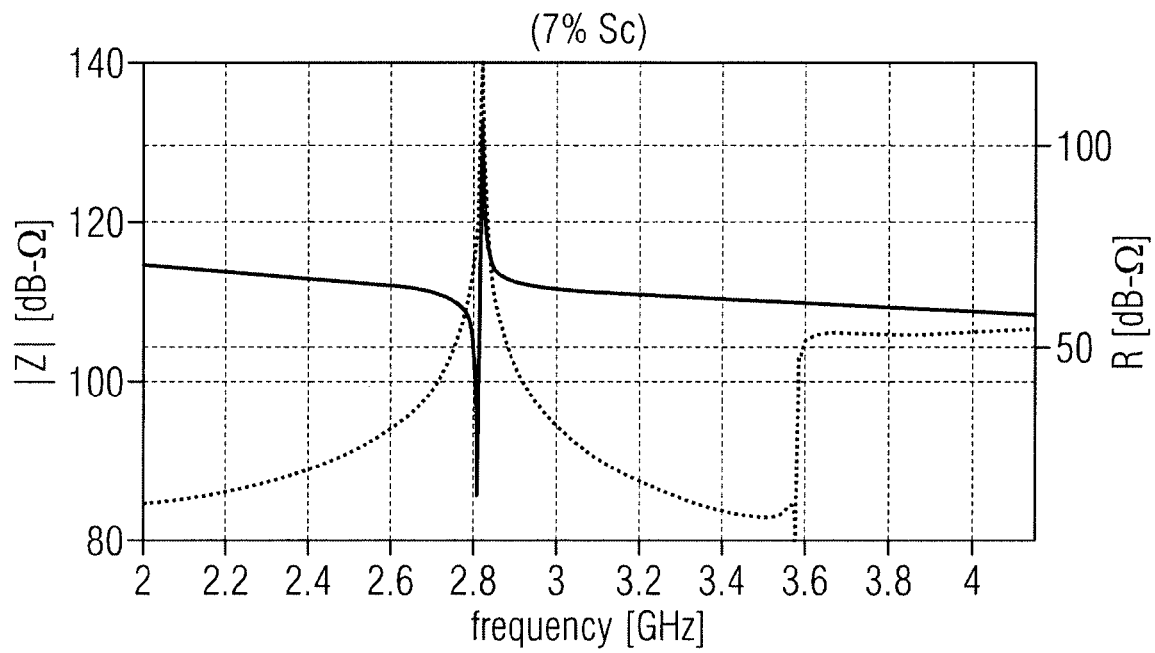
Figure 6B:
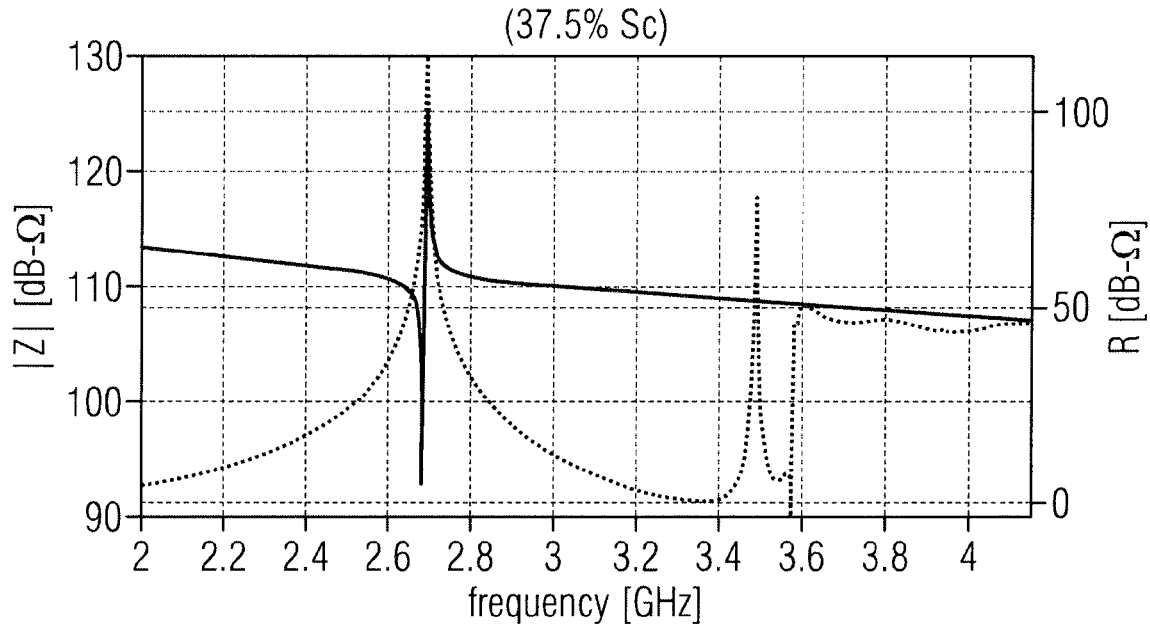
Figure 7A:
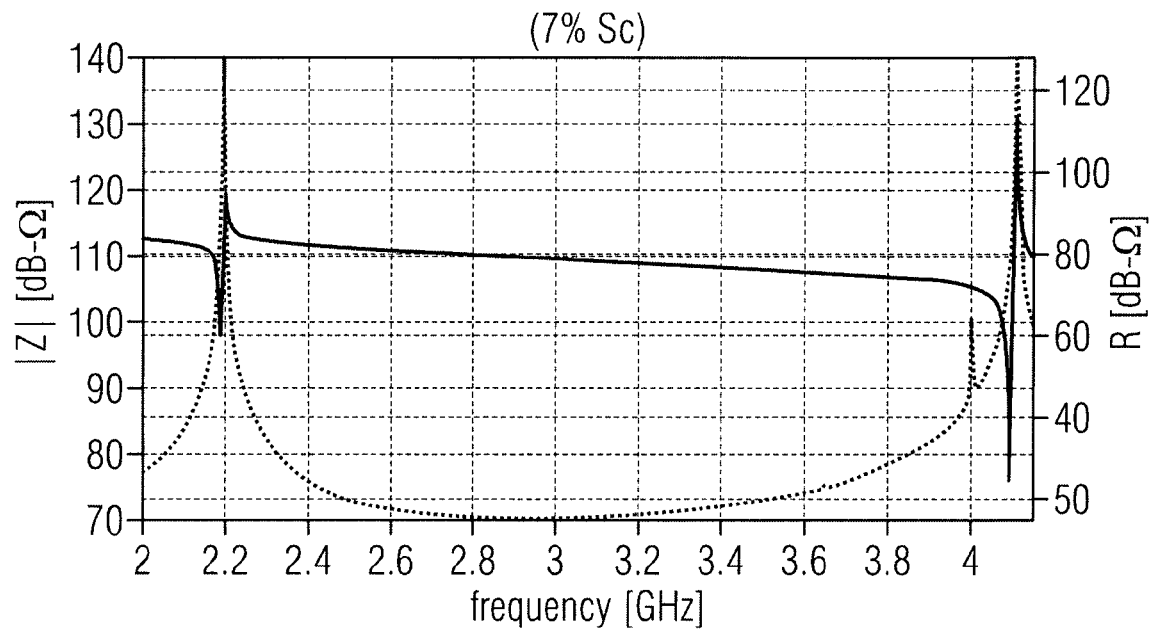
Figure 7B:
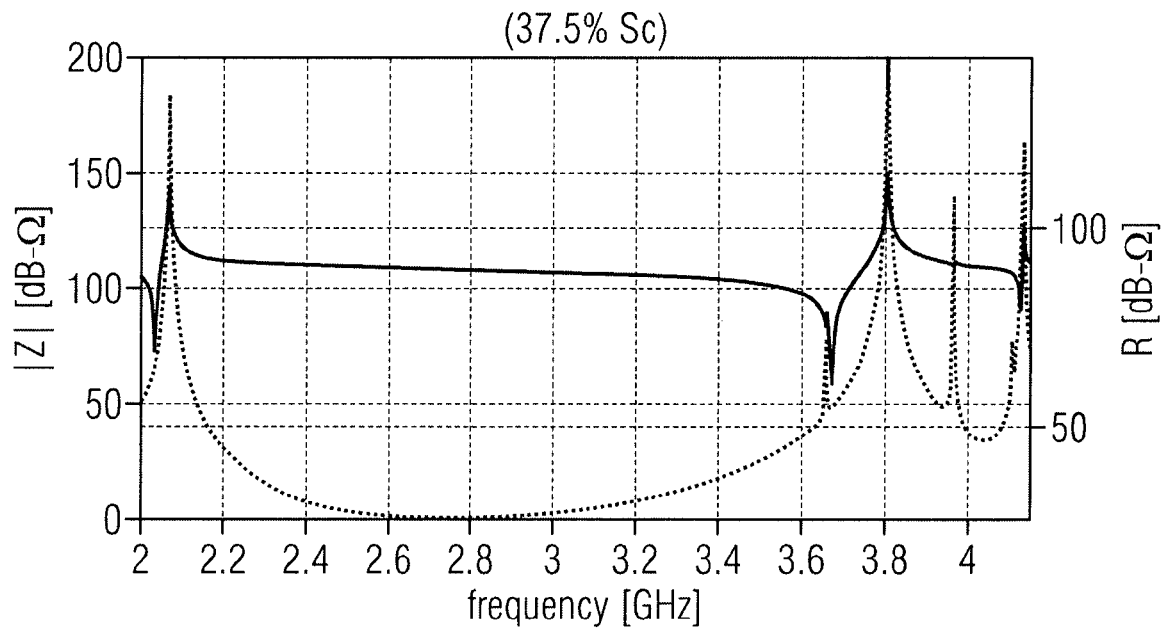

FIG. 2 shows a schematic cross section through a layer system comprising a sapphire R-plane substrate, an AlScN layer arranged thereon and an electrode structure for a SAW device according to a first embodiment FIG. 3 shows a similar layer system with an electrode structure according to a second embodiment FIG. 4 shows a schematic top view onto a wafer with the layer system and electrode structure according to the first embodiment FIG. 5 shows a schematic top view onto a wafer with the layer system and electrode structure according to the second embodiment FIGS. 6A and 6B show the admittance of a SAW resonator build on the layer system of the first embodiment with different amounts of Sc in AlScN FIGS. 7A and 7B show the admittance of a SAW resonator build on the layer system of the second embodiment with different amounts of Sc in AlScN FIG. 1 shows schematically the position of the R-plane within a sapphire crystal.

An AlScN layer with 40 mol % Sc content may be epitaxially grown directly onto this R-plane sapphire wafer. In this case the [11-20]-direction of the AlScN layer is the normal to the substrate surface (x-cut AlScN). According to an advantageous embodiment a seed layer system e.g. made of pure and undoped AlN can be grown as a bottom layer onto the sapphire substrate. Such an AlN layer may support the epitaxial growth. The thickness of the seed layer can be as thin as 30 nm but can be adapted as required For epitaxial growing of an AlScN layer onto the seed layer a deposition technique is selected from metal-organic CVD (MOCVD), plasma-enhanced CVD (PECVD), molecular beam epitaxy (MBE), atomic layer deposition (ALD), sol-gel deposition, high temperature sputtering and pulsed laser deposition PLD.

Moreover, due to the fact that the sound velocity within this material different to the velocity within AlScN improved acoustical properties like e.g. a wave guiding effect of the layer system is achieved. The c-axis of the grown AlScN layer is oriented parallel to the first surface of the sapphire substrate.

On top of the AlScN layer interdigital transducers utilizing e.g. Al or Cu based electrodes are realized with a specific orientation with respect to the crystallographic axes of the AlScN.

FIG. 2 shows the principle layer stack with a thin seed layer of AlN, a thin AlScN layer and an electrode structure IDT having a first possible orientation with respect to the crystallographic axes of both $Al_2O_3$ and AlScN according to the first embodiment. In this embodiment the SAW device that is achieved by the electrode structure IDT in FIG. 2 excites a main acoustic wave with a shear character. The propagation direction is the crystallographic [1-100] direction of AlScN. The thickness of the piezoelectric AlScN layer is chosen in dependence of the mid frequency set by the pitch of the electrode structure to be within a range of 0.5 to 1.5 times the wavelength λ. Higher thicknesses are possible but not required. The thickness ratios of the different layers can be modified in a way that a maximum wave guiding effect can be achieved.

FIG. 3 shows the same layer stack but provided with an electrode structure IDT having a second possible orientation with respect to the crystallographic axes of both $Al_2O_3$ and AlScN according to the second embodiment. Actually the IDT is rotated by 90° around the surface normal with respect to the IDT orientation in FIG. 2. In this embodiment of FIG. 3 the SAW device excites a main acoustic wave with a Rayleigh character. The propagation direction is the crystallographic direction of AlScN.

Additional functional layers like passivation layers, temperature compensation layers or frequency trimming layers can be applied on top of the SAW electrode structures.

The benefit of such a micro-acoustic device with the proposed layer system lies in the combination of the advantages related to the design flexibility for SAW devices and that of the easy production of BAW devices. In SAW devices the main frequency defining planar structures are patterned by lithography methods with an excellent uniformity allowing the realization of resonators all having different frequencies in one process step. The benefits provided by BAW technology are due to possible thin film processing. These are e.g. a very good thickness control, good layer adhesion, low cost processing, low material consumption, full integration into a wafer line, realization of layers on large diameter wafers and easy variation of the chemical layer composition. Compared to the former process for manufacturing thin film SAW devices by bonding and thinning single crystal piezo wafers the benefits of the thin film technology make the new layer system and the SAW devices produced thereon superior to the "old" technology.

Additional benefits related to the use of sapphire wafers are reduced RF losses not requiring a complex trap rich layer technology typically necessary when using high resistivity Si wafers. Further, an excellent thermal conductivity improving the power durability of the micro-acoustic devices has to be stressed. Moreover, the high sound velocity in the layer system supports wave guiding of micro-acoustic layers. The relatively high sound velocity achievable with the AlN based material system also enables the realization of high frequency surface acoustic wave devices with relaxed requirements concerning the photolithography technology used.

FIGS. 4 and 5 show a top view of two exemplary orientations of the SAW electrode structure IDT with respect to the crystallographic axes of the AlScN layer.

In FIG. 4 the c-axis [000-1] of the AlScN layer is inclined by 90° with respect to the surface normal and the orientation of the electrode structure IDT enables a main SAW propagation along the [1-100]-direction.

In FIG. 5 the c-axis [000-1] of the AlScN layer is inclined by 90 with respect to the surface normal and the orientation of the electrode structure IDT direction enables a main SAW propagation direction along the crystallographic c-axis ([000-1]-direction). In this second embodiment the electrode structure IDT is rotated by 90° compared to the electrode structure IDT shown in FIG. 4.

FIGS. 6A, 6B show admittance curves of a SAW resonator according to the configuration given in FIG. 4. For the simulation, published material properties for AlScN piezoelectric layers with 7% Sc content (FIG. 6A) and 37.5% Sc content respectively (FIG. 6B) have been used. Layer thickness of AlScN is about 1200 nm/3700 nm (first value for low Sc content, second value for high Sc content). The electrode structure IDT is embodied by Cu electrodes with a height of about 100 nm. The respective pitch of a transducer of the electrode structure is in both cases set to 0.8 µm. The metallization ratio a/p where a is finger width and p is a distance between centers of neighbored electrode fingers is set to be about 0.45.

The propagation direction of the SAW is parallel to the [−1100]-direction of the AlScN. With this configuration, a shear horizontal SAW mode can be excited.

FIGS. 7A and 7B show admittance curves of SAW resonators according to the configuration given in FIG. 5. Again, for the simulation the same published material properties for AlScN piezoelectric layers with 7% Sc content (FIG. 7A) and 37.5% Sc content respectively (FIG. 7B) have been used. Layer thickness of AlScN is about 1000 nm/800 nm (first value for low Sc content, second value for high Sc content). The electrode structure IDT is embodied by Cu electrodes with a height of about 150 nm. The respective pitch of a transducer of the electrode structure is in both cases set to 0.8 µm. The metallization ratio a/p where a is finger width and p is a distance between centers of neighbored electrode fingers is set to be about 0.5/0.4 (first value for low Sc content, second value for high Sc content). The propagation direction of the SAW is parallel to the crystallographic c-axis ([000-1]-direction). With this configuration, a pure Rayleigh mode SAW can be excited. A smaller piezoelectric coupling can be achieved by reducing the Sc content of the AlScN layer (as set for embodiment of FIG. 7A with 7% Sc when compared with the higher Sc content of 37.5% in FIG. 7B)

Due to the limited number of embodiments the invention shall not be limited to these embodiments. The layer system may be used for realizing other devices with other electrode structures, differing layer thicknesses and combinations with additional layers that may be helpful for special purposes. Realization and effects of such variations are known per se from the art. A full scope of the invention is given by the claims.

We claim:
1. A layer system comprising:
   a monocrystalline sapphire substrate having a first surface;
   a crystalline piezoelectric layer comprising an aluminum nitride (AlN), grown epitaxially on the first surface, and having a second surface facing away from the first surface;
   wherein the first surface is a crystallographic R-plane of sapphire;
   wherein the epitaxial relationship between the monocrystalline sapphire substrate and the crystalline piezoelectric layer is as follows:
   a (11-20)-plane of the crystalline piezoelectric layer (x-cut) is parallel to a (1-102)-plane of the monocrystalline sapphire substrate (R-plane),
   an in-plane [1-100]-direction of the crystalline piezoelectric layer is parallel to a [-1-120]-direction of the monocrystalline sapphire substrate, and
   an in-plane [000-1]-direction (crystallographic c-axis) of the crystalline piezoelectric layer is parallel to a [1-10-1]-direction of the monocrystalline sapphire substrate.

2. The layer system of claim 1, wherein the crystalline piezoelectric layer comprises the AlN doped with a dopant that improves piezoelectric coupling.

3. The layer system of claim 2, wherein the crystalline piezoelectric layer comprises c-axis oriented aluminum scandium nitride (AlScN), and wherein an amount of dopant scandium (Sc) contained in the crystalline piezoelectric layer is between 5 and 45 at %.

4. The layer system of claim 1, wherein the crystalline piezoelectric layer comprises the AlN doped with scandium (Sc), and wherein a seed layer of pure AlN is arranged between the monocrystalline sapphire substrate and the crystalline piezoelectric layer of scandium doped aluminum nitride (AlScN).

5. The layer system of claim 1, comprising a layer of silicon dioxide ($SiO_2$) deposited onto the second surface.

6. A surface acoustic wave (SAW) device comprising the layer system of claim 1 and having an interdigital electrode structure arranged on top of the second surface.

7. The SAW device of claim 6, wherein the interdigital electrode structure is adapted to excite a SAW in the crystalline piezoelectric layer having a given wavelength $\lambda$, ≤wherein a thickness dP of the crystalline piezoelectric layer is chosen according to a relation $0.3\lambda \leq d_P \leq 3\lambda$.

8. The SAW device of claim 6, wherein the first surface is tilted against the R-plane by an angle δ of 0.5° to 6°.

9. The SAW device of claim 6, wherein the interdigital electrode structures have an in-plane orientation with a rotation angle between 0° and 90° around a surface normal.

10. The SAW device of claim 6, wherein the interdigital electrode structure comprises copper (Cu) and/or aluminum (Al).

11. The SAW device of claim 6, comprising further functional layers chosen from a group of a passivation layer, a trimming layer of silicon nitride (SiN) and a temperature compensation layer.

* * * * *